US010019028B2

(12) United States Patent
Loparco et al.

(10) Patent No.: US 10,019,028 B2
(45) Date of Patent: *Jul. 10, 2018

(54) LATCH AND SPRING ASSEMBLY

(71) Applicant: International Business Machines Corporation, Armonk, NY (US)

(72) Inventors: John J. Loparco, Poughkeepsie, NY (US); David C. Olson, Lagrangeville, NY (US); Michael T. Peets, Staatsburg, NY (US); John G. Torok, Poughkeepsie, NY (US); Wade H. White, Hyde Park, NY (US); Mitchell L. Zapotoski, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/607,386

(22) Filed: Jan. 28, 2015

(65) Prior Publication Data

US 2016/0219744 A1 Jul. 28, 2016

(51) Int. Cl.
*G06F 1/16* (2006.01)
*H05K 7/14* (2006.01)

(52) U.S. Cl.
CPC ............. *G06F 1/16* (2013.01); *H05K 7/1401* (2013.01); *H05K 7/1405* (2013.01); *H05K 7/1407* (2013.01); *H05K 7/1411* (2013.01); *H05K 7/1492* (2013.01)

(58) Field of Classification Search
CPC ... H05K 7/1401; H05K 7/1405; H05K 7/1407
See application file for complete search history.

(56) References Cited

U.S. PATENT DOCUMENTS

| 5,293,303 A | * | 3/1994 | Fletcher | ............... | H05K 7/1409 |
| | | | | | 211/41.17 |
| 5,966,289 A | * | 10/1999 | Hastings | ................. | G06F 1/184 |
| | | | | | 165/185 |
| 6,302,714 B1 | * | 10/2001 | Bologna | ................ | G06F 1/184 |
| | | | | | 439/157 |

(Continued)

FOREIGN PATENT DOCUMENTS

WO 2004107503 A1 12/2004

OTHER PUBLICATIONS

List of IBM Patents or Patent Applications Treated as Related, Appendix P, Filed Herewith, 2 pages.

(Continued)

*Primary Examiner* — Zachary M Pape
*Assistant Examiner* — Douglas Burtner
(74) *Attorney, Agent, or Firm* — Daniel R. Simek

(57) ABSTRACT

One aspect of the invention discloses an apparatus for mating computing device structures. The apparatus comprises one or more rotatable latches, the one or more rotatable latches each including a respective screw mechanism housed within the one or more rotatable latches. The apparatus further comprises one or more spring assemblies, the one or more spring assemblies each including a respective thread assembly housed within the one or more spring assemblies. The respective thread assemblies comprise threading that is capable of receiving a corresponding screw mechanism of the one or more rotatable latches.

15 Claims, 6 Drawing Sheets

(56) References Cited

U.S. PATENT DOCUMENTS

| | | | |
|---|---|---|---|
| 6,884,096 B2* | 4/2005 | Centola | H01R 13/62933 361/798 |
| 7,027,309 B2* | 4/2006 | Franz | H01R 13/62933 361/732 |
| 7,113,401 B2* | 9/2006 | Becker | G06F 1/183 165/122 |
| 7,380,995 B2* | 6/2008 | Chan | G02B 6/3897 361/728 |
| 8,425,286 B2* | 4/2013 | Coster | G06F 1/181 361/695 |
| 9,022,496 B2* | 5/2015 | Armstrong | F24C 15/16 312/319.3 |
| 2004/0062013 A1* | 4/2004 | Kim | G06F 1/184 361/752 |
| 2004/0231826 A1 | 11/2004 | Armstrong | |
| 2006/0221582 A1* | 10/2006 | DeNies | H05K 7/1409 361/752 |
| 2007/0026718 A1 | 2/2007 | Sturm et al. | |
| 2008/0024991 A1* | 1/2008 | Colbert | H01L 23/4093 361/704 |
| 2009/0201642 A1 | 8/2009 | Diaz | |
| 2010/0062644 A1 | 3/2010 | Aekins et al. | |
| 2011/0101833 A1 | 5/2011 | Olesiewicz et al. | |
| 2012/0002364 A1* | 1/2012 | Goodman | G06F 1/187 361/679.33 |
| 2012/0127658 A1 | 5/2012 | Hartman et al. | |
| 2012/0133255 A1* | 5/2012 | Izuno | H05K 7/20727 312/236 |
| 2012/0155018 A1* | 6/2012 | Gerken | G06F 1/20 361/679.54 |
| 2013/0265695 A1 | 10/2013 | Canfield et al. | |
| 2013/0337671 A1* | 12/2013 | Tsang | H01R 13/6275 439/159 |
| 2014/0049964 A1* | 2/2014 | McClure | B23P 15/26 362/249.06 |
| 2015/0082823 A1 | 3/2015 | Teraki et al. | |
| 2015/0103472 A1* | 4/2015 | Oneufer | H01H 71/56 361/605 |

OTHER PUBLICATIONS

Loparco, et al., "Latch and Spring Assembly", U.S. Appl. No. 15/014,273, filed Feb. 3, 2016.

Baitinger et al. "System control structure of the IBM eServer z900", pp. 523-535, IBM J. Res. & Dev. vol. 46 No. 4/5 Jul./Sep. 2002, © Copyright 2002 by International Business Machines Corporation, accepted for publication Apr. 3, 2002.

Goth et al. "Hybrid cooling with cycle steering in the IBM eServer z990", pp. 409-423, IBM J. Res. & Dev. vol. 48 No. 3/4 May/Jul. 2004, © Copyright 2004 by International Business Machines Corporation, accepted for publication Mar. 30, 2004; Internet publication Jun. 1, 2004.

* cited by examiner

LATCH AND SPRING ASSEMBLY

BACKGROUND OF THE INVENTION

The present invention relates generally to the field of computing device structures, and more particularly to a latch and spring assembly for installing a pluggable computing device.

A central electronic complex (CEC) structure is a set of hardware that defines a computer assembly (e.g., a mainframe computer), which includes central processing units (CPUs), computer memory, communication channels, data controllers, storage devices, power supplies, and other computing components. A CEC can be installed into a rack (e.g., a server rack) that is a component of a mainframe computer assembly or another collection of computing devices. Mainframe computers are computing systems that are utilized for critical applications and bulk data processing, such as statistical processing, enterprise resource planning, and transaction processing.

CECs are capable of connecting and interfacing with additional computing components and electronic assemblies of a mainframe computer or other computing system, and many such components are capable of plugging into a CEC. For example, a power supply can be a pluggable device that can be attached to a CEC as part of a mainframe computer assembly. In additional examples, distributed converter assemblies (DCAs) can be pluggable devices that may be installed with a connection to a CEC.

SUMMARY

One aspect of the invention discloses an apparatus for mating computing device structures. The apparatus comprises one or more rotatable latches, the one or more rotatable latches each including a respective screw mechanism housed within the one or more rotatable latches. The apparatus further comprises one or more spring assemblies, the one or more spring assemblies each including a respective thread assembly housed within the one or more spring assemblies. The respective thread assemblies comprise threading that is capable of receiving a corresponding screw mechanism of the one or more rotatable latches. In another aspect, the one or more rotatable latches are coupled to a pluggable electronic device, and the one or more spring assemblies are coupled to a supporting structure.

BRIEF DESCRIPTION OF THE DRAWINGS

The following detailed description, given by way of example and not intended to limit the disclosure solely thereto, will best be appreciated in conjunction with the accompanying drawings, in which.

DETAILED DESCRIPTION

Figure 1:
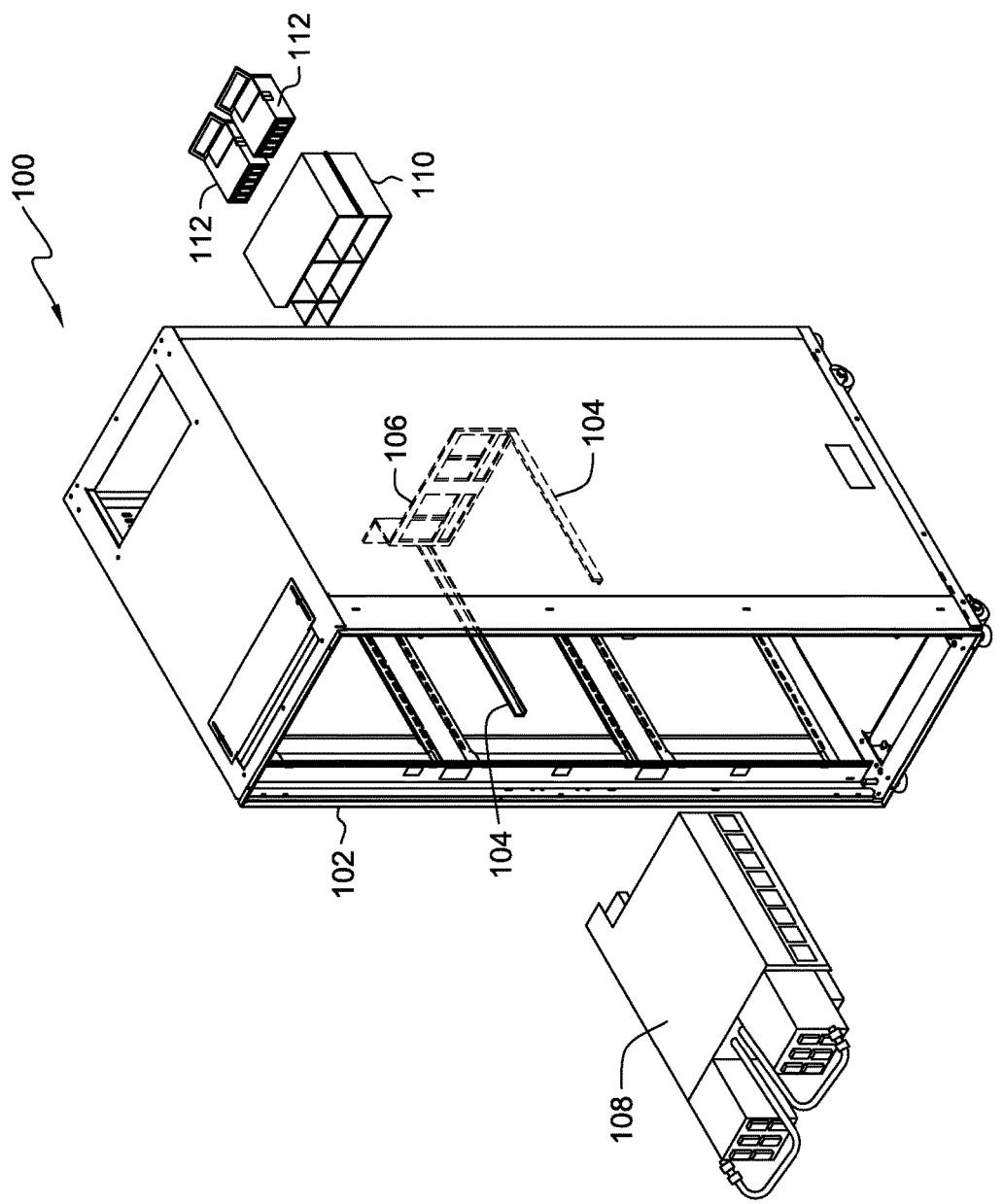
FIG. 1 is an example depiction illustrating a data processing system, in accordance with one embodiment of the present invention.

Detailed embodiments of the present invention are disclosed herein with reference to the accompanying drawings; however, it is to be understood that the disclosed embodiments are merely illustrative of potential embodiments of the invention and may take various forms. In addition, each of the examples given in connection with the various embodiments is also intended to be illustrative and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the disclosed structures and methods, as oriented in the drawing figures. The terms "overlying," "atop," "on," "positioned on," or "positioned atop" mean that a first element, such as a first structure, is present on a second element, such as a second structure, wherein intervening elements, such as an interface structure may be present between the first element and the second element. Additionally, the terms "coupled to" and "attached to" mean that a first element, such as a first structure, is coupled to a second element, such as a second structure, wherein intervening elements, such as an interface structure may be present between the first element and the second element.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Embodiments of the present invention provide a latch and spring assembly that provides a mechanism for mating and pre-loading electronic assembly interconnects.

The present invention will now be described in detail with reference to the Figures. FIG. 1 is an example depiction illustrating data processing system 100, in accordance with one embodiment of the present invention. FIG. 1 illustrates an exploded view of example computing components that may be assembled together in a computing system of data processing system 100. Data processing system 100 can be a mainframe computer or assembly of computing systems that utilizes a system frame (e.g., a system rack). Data processing system 100 includes rack 102, rails 104, bulkhead 106, central electronic complex (CEC) 108, air moving assembly (AMA) 110, and distributed converter assemblies (DCAs) 112.

Rack 102 is a system frame (e.g., a server rack, a server cabinet, a computer cabinet), which is capable of housing multiple computing systems (e.g., CEC 108). Rack 102 can include one or more sets of rails 104, which allow for a horizontal installation of computing systems into rack 102. Rails 104 are coupled to the side-walls of rack 102 and provide structural support to a horizontally installed computing system (e.g., CEC 108). In other embodiments, rails 104 can be in a different configuration and/or location within rack 102, while still providing support to a computing device. In additional embodiments, rack 102 can include additional instances of rails 104 (not shown), which allows additional computing devices to be installed and housed within rack 102. Rack 102 further includes one or more instances of bulkhead 106. Bulkhead 106 provides a back surface to which computing devices that are installed in rack 102 (on rails 104) can be structurally coupled. For example, a computing device (e.g., CEC 108) is installed in rack 102 on rails 104, and a portion (e.g., a back portion) of the computing device is structurally coupled to bulkhead 106. In various embodiments, bulkhead 106 is capable of interfacing with computing devices (e.g., AMA 110 and DCAs 112) on both sides of bulkhead 106 (e.g., via gasket features, screw retention features, brackets, etc.).

Central electronic complex (CEC) 108 is a computing structure that includes a set of hardware that defines a computer assembly (e.g., a mainframe computer or other computing system utilizing a system frame, such as rack 102). In example embodiments, CEC 108 can include, or attach to, computing components including central processing units (CPUs), computer memory, communication channels, data controllers, storage devices, power supplies, etc. In one embodiment, CEC 108 is installed horizontally into rack 102, utilizing rails 104, and is structurally coupled to bulkhead 106. CEC 108 may be secured within rack 102 and structurally coupled to bulkhead 106 utilizing a variety of known techniques.

Air moving assembly (AMA) 110 is a supporting structural enclosure that provides the ability to enclose the air-moving devices (AMDs) and DCAs that are attached to CEC 108. In an example embodiment, AMA 110 is a metal enclosure that includes a plurality of sections that are capable of enclosing and housing computing components. For example, AMA 110 is capable of providing a supporting enclosure for devices, such as DCAs 112. In one embodiment, AMA 110 is installed horizontally by structurally coupling AMA 110 to bulkhead 106 (e.g., on an opposite side of bulkhead 106 relative to the installation of CEC 108). In various embodiments, AMA 110 can be structurally coupled to CEC 108, via bulkhead 106. AMA 110 may be secured (e.g., to bulkhead 106 and/or CEC 108) utilizing a variety of known techniques.

Distributed convertor assemblies (DCAs) 112 are pluggable devices, which can include electronic assembly interconnects, that can plug into CEC 108 and be enclosed by AMA 110. In various embodiments, DCAs 112 can be a variety of computing components or electronic assemblies that can plug into, and structurally attach to, CEC 108 (e.g., via bulkhead 106). In another embodiment, DCAs 112 can be computing components that can be enclosed and supported by a section of AMA 110. In an example, DCAs 112 are each an assembly of power supplies and cooling fans that comprise a pluggable device (e.g., into CEC 108). In one embodiment, DCAs 112 are installed (e.g., plugged into and attached to) in connection to CEC 108 and enclosed by AMA 110. In another embodiment, electronic assembly interconnects of DCAs 112 are mated to corresponding receiving electronic assemble interconnects of CEC 108.

Figure 2A:
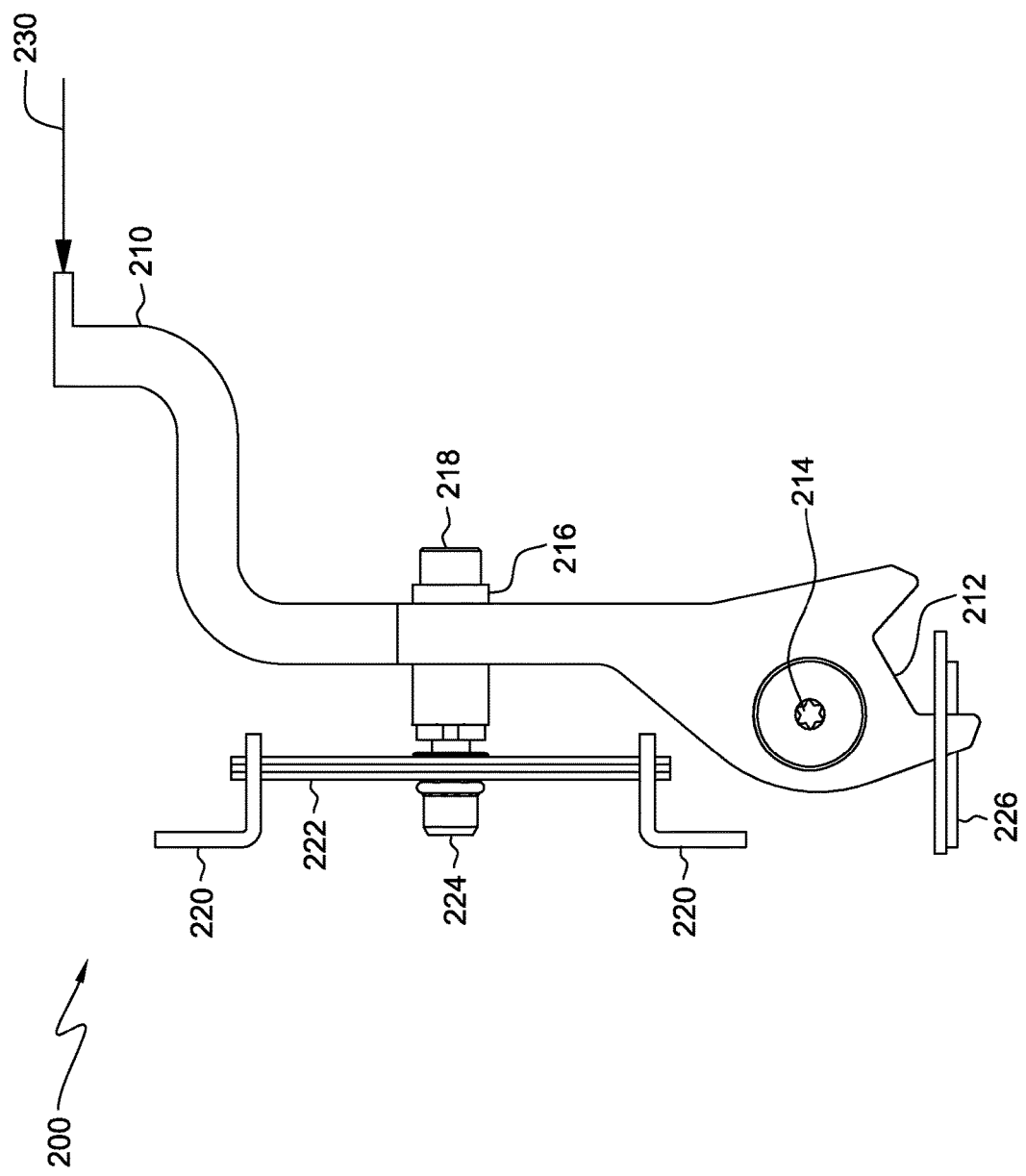
FIG. 2A illustrates a top-down view of a latch assembly, in accordance with embodiments of the present invention.

FIG. 2A illustrates a top-down view of latch assembly 200, in accordance with embodiments of the present invention.

Latch assembly 200 includes latch 210. Latch 210 is a rotatable latch that includes latch claw 212, pivot 214, and screw housing 216, which includes floating screw 218. In one embodiment, latch 210 is resident to a DCA (e.g., a power supply or other electronic assembly) and engages receiving features that are housed on an AMA (not shown) or other supporting structure (e.g., spring mounts 220, spring 222, thread assembly 224, and claw catch 226). In other embodiments, latch 210 can be a different form of force applying member attached to a DCA and capable of engaging receiving features housed on an AMA. In example embodiments, latch 210 can be made of various materials known in the art (e.g., 1008 steel, 6061 aluminum, etc.).

Latch claw 212 is an area of latch 210 (e.g., a claw portion of latch 210) that engages with a receiving feature of a supporting structure (e.g., claw catch 226 on an AMA) when latch 210 is in a closed position. In one embodiment, applying force 230 to latch 210 closes latch 210, which engages latch claw 212 into claw catch 226 (e.g., a latch catch on the AMA). In an example, force 230 is a humanly applied force to the end of latch 210.

Pivot 214 is the pivot point that latch 210 rotates on. Pivot 214 is attached to a DCA (not shown), such as a power supply, and allows latch 210 to be a rotatable latch that is resident to the DCA. In an example embodiment, applying force 230 to an end portion of latch 210 causes latch 210 to rotate on pivot 214 and engage latch claw 212 into claw catch 226, providing a mechanical advantage that is capable of overcoming the resistance of a connector mating force from a DCA to a CEC (e.g., the mating force required to "plug" electronic connections of a DCA into a CEC).

Screw housing 216 is a portion of latch 210 that includes floating screw 218. Screw housing 216 provides a means for floating screw 218 to be contained within latch 210 and allows floating screw 218 to be accessible on either side (e.g., either open portion) of screw housing 216. In an example embodiment, screw housing 216 allows floating screw 218 to rotate within screw housing 216.

Floating screw 218 is housed within screw housing 216 and is capable of engaging (e.g., screwing into thread assembly 224) features that are housed on an AMA (not shown) or another supporting structure. In various embodiments, floating screw 218 can be any type of screw, or other attachment feature (e.g., a fastener) known in the art that is capable of rotating within screw housing 216 (e.g., as a "floating" screw) and mating to a receiving feature housed on a supporting structure (e.g., a nut or a thread assembly).

Additionally, latch assembly 200 includes a receiving feature, which is comprised of spring mounts 220, spring 222, and thread assembly 224.

Spring mounts 220 are attached to a supporting structure (e.g., an AMA (not shown)) and provide a means to attach and support spring 222. In one embodiment, spring mounts 220 provide a means to attach spring 222 horizontally (e.g., horizontally and substantially parallel) on an AMA. In various embodiments, spring mounts 220 can be made of various materials known in the art (e.g., 1008 steel, 6061 aluminum, etc.).

Spring 222 is supported by spring mounts 220 and is attached to a supporting structure (e.g., an AMA (not shown)). In one embodiment, spring 222 is a cantilever spring. In another embodiment, spring 222 is a leaf spring. In various other embodiments, spring 222 can be another spring shape and type, such as a wave, coil, conical, etc. Spring 222 deforms under a load provided by latch 210 (e.g., via floating screw 218).

Thread assembly 224 is included in, or a component of, spring 222. Thread assembly 224 is capable of mating with floating screw 218, which results in securing latch 210. In an example embodiment, thread assembly 224 is a nut that is a component of spring 222 (e.g., a nut attached to one or more leaf springs) and includes threading that allows floating screw 218 to be screwed into thread assembly 224. Spring 222 and thread assembly 224 are discussed in further detail with regard to FIG. 2B.

In one scenario, force 230 is applied to latch 210, which closes latch 210. Floating screw 218 engages to thread assembly 224 of spring 222, whereby an additional load is provided and floating screw 218 is advanced into (e.g., screwed into) thread assembly 224, which secures latch 210 and deforms spring 222. Completion of securing latch 210 and deforming spring 222 can fully mate a connector interface of a DCA to a CEC and provides the desired mechanical pre-load. In another embodiment, characteristics of spring 222 can be tuned to overcome added reactionary forces associated with gasket structures surrounding connectors of a DCA. For example, floating screw 218 is tightened into thread assembly 224 to a fixed torque, which is a torque capable of overcoming any residual connector mating force (e.g., of the DCA to the CEC) and spring pre-load established by deformation. Residual connector mating force may be the result of a connection that is under-mated by latching alone.

In one example, force 230 is applied (e.g., by a human) to an end portion of latch 210, which causes latch 210 to rotate on pivot 214 and latch claw 212 to engage claw catch 226. Floating screw 218, which is housed by screw housing 216 of latch 210, mates with thread assembly 224, which is included in spring 222. Floating screw 218 is advanced into thread assembly 224, deforming spring 222, which is supported by spring mounts 220 that are attached to a supporting structure (e.g., an AMA).

Figure 2B:
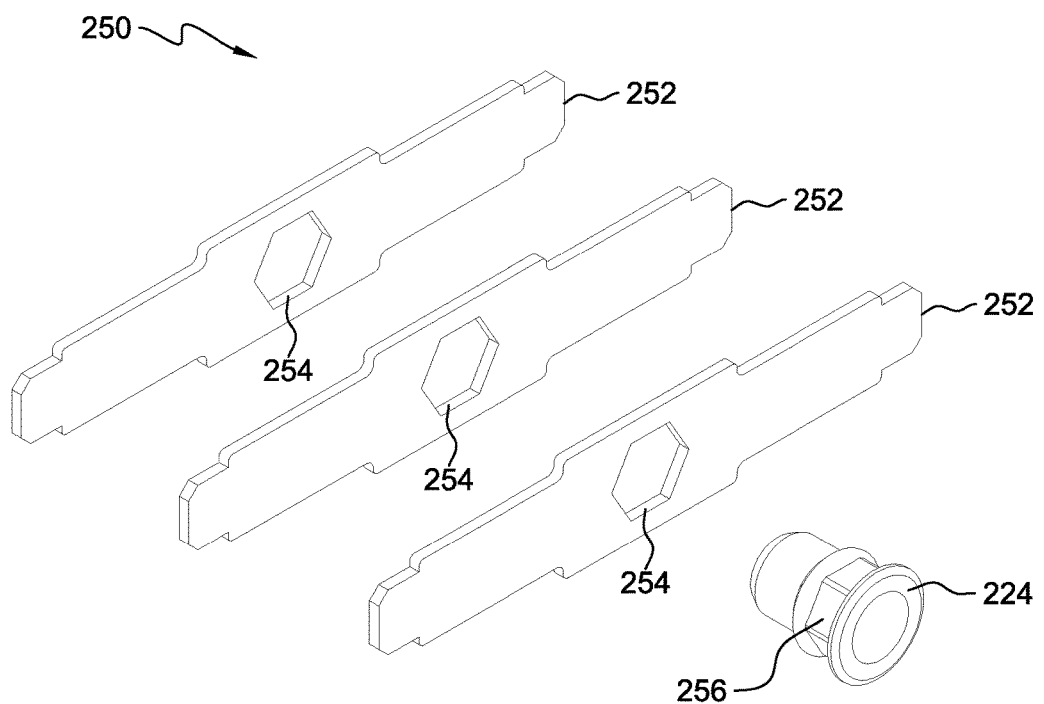
FIG. 2B illustrates an exploded view of an example of a spring assembly, in accordance with embodiments of the present invention.

FIG. 2B illustrates an example of an exploded view of spring assembly 250, in accordance with embodiments of the present invention.

Spring assembly 250 includes thread assembly 224, which includes spring attachment portion 256, and leaf springs 252, which include respective instances of thread housings 254. In one embodiment, leaf springs 252 are components of spring 222, which is comprised of one or more springs that are coupled together (e.g., one or more leaf springs adhesively and/or mechanically coupled to each other). In various embodiments, each instance of leaf springs 252 includes a respective instance of thread housing 254. When leaf springs 252 are coupled together (e.g., forming spring 222), each instance of thread housing 254 is aligned to form an opening that is capable of housing thread assembly 224. In an example embodiment, thread assembly 224 includes spring attachment portion 256, which corresponds to thread housing 254. Spring attachment portion 256 allows thread housing 254 to secure and house thread assembly 224 within leaf springs 252 (e.g., and spring 222). In the depicted example, thread housing 254 and spring attachment portion 256 have matching hexagonal portions that allow thread assembly 224 to be housed by thread housing 254. In additional embodiments, thread housing 254 and spring attachment portion 256 can utilize different attachment methods, providing that spring 222 is capable of housing thread assembly 224.

Figure 3:
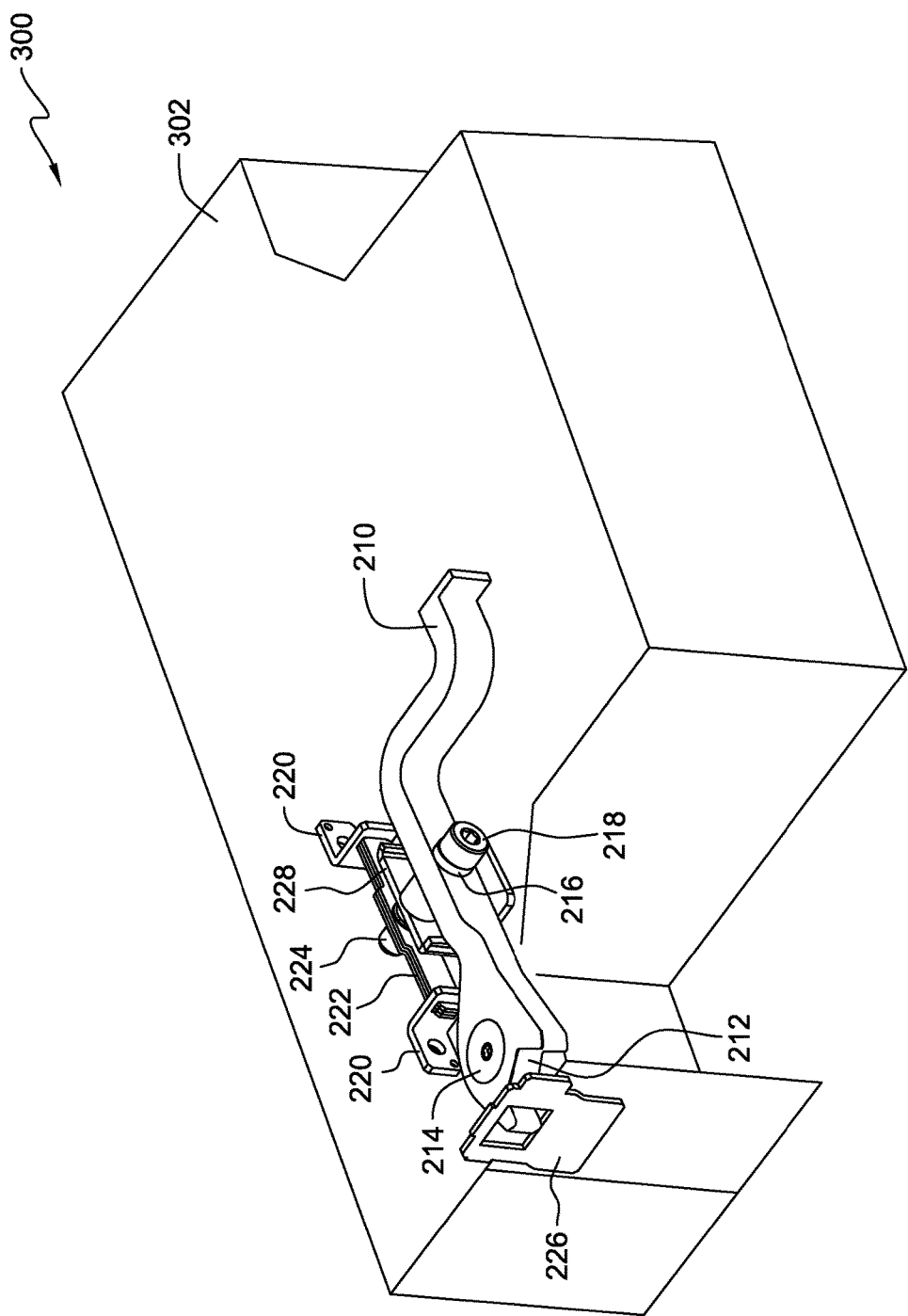
FIG. 3 illustrates an electronic assembly that includes a latch assembly, in accordance with embodiments of the present invention.

FIG. 3 illustrates a view of electronic assembly 300, in accordance with embodiments of the present invention.

Electronic assembly 300 includes electronic assembly device 302 and latch 210, which is resident to electronic assembly device 302. In one embodiment, electronic assembly device 302 is a DCA (e.g., a power supply or other electronic assembly).

In the depicted embodiment, latch 210 is attached to electronic assembly device 302 via pivot 214. Pivot 214 allows latch 210 to be a rotatable latch, which is resident to electronic assembly device 302. Spring 222 is supported by spring mounts 220 and is attached to a supporting structure (e.g., an AMA (not shown)). In an example, latch 210 is closed and floating screw 218 is advanced into thread assembly 224, which can deform spring 222.

In additional embodiments, bracket assembly 228 is attached to electronic assembly device 302 (e.g., a DCA) and includes an opening that is aligned with thread assembly 224 (and floating screw 218, when latch 210 is closed). In various embodiments, bracket assembly 228 can be made of various materials known in the art (e.g., 1008 steel, 6061 aluminum, etc.). Bracket assembly 228 allows floating screw 218 to mate to thread assembly 224 via an opening in bracket assembly 228 and limits travel or deflection of spring 222. Controlling the travel and/or deflection of spring 222 allows the mechanical loading effects to be tuned to optimize connector mating load variation due to physical assembly tolerances. Bracket assembly 228 can also provide support for electronic assembly device 302 when mated to the supporting structure attached to spring mounts 220 (not shown). In other embodiments, bracket assembly 228 can be a shape and structure other than depicted in FIG. 3, providing that bracket assembly 228 allows mating of floating screw 218 to thread assembly 224.

Figure 4:
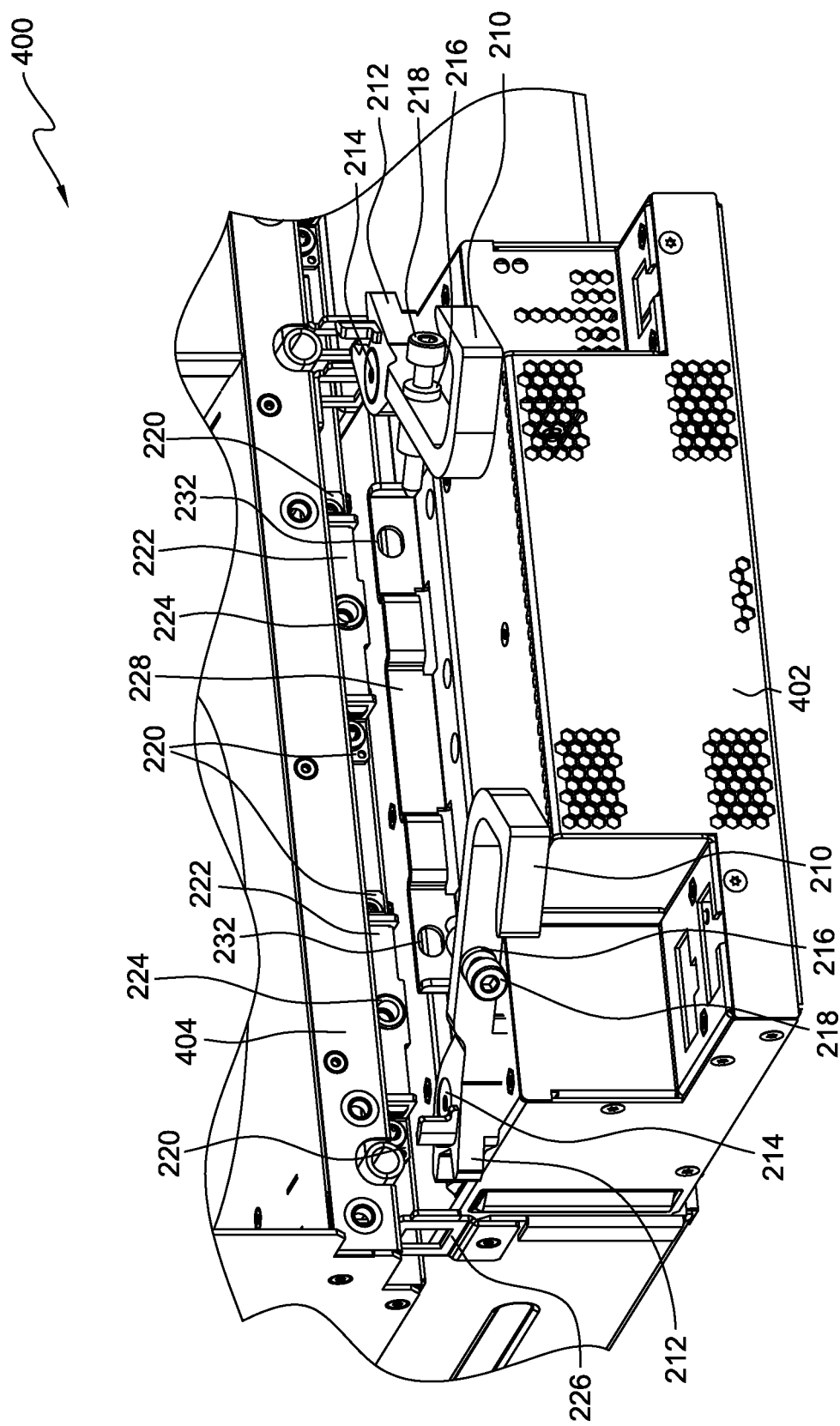
FIG. 4 illustrates an electronic assembly that includes a latch assembly and a supporting structure, in accordance with embodiments of the present invention.

FIG. 4 illustrates a view of electronic assembly 400, in accordance with embodiments of the present invention.

Electronic assembly 400 includes DCA 402 and AMA 404. In FIG. 4, DCA 402 is shown partially inserted into a portion of AMA 404. In one embodiment, DCA 402 is an electronic assembly device, such as an instance of DCAs 112 (previously described in FIG. 1). In an example, DCA 402 is an assembly of power supplies and cooling fans that comprise a pluggable device (e.g., into AMA 404).

In one embodiment, AMA 404 is a support structure, such as AMA 110 (previously described in FIG. 1). In an example, AMA 404 is a supporting structural enclosure that provides the ability to enclose the air-moving devices (AMDs) and DCAs (e.g., DCA 402) that are attached to a CEC (e.g., CEC 108 in FIG. 1).

In the depicted embodiment, latches 210 are attached to DCA 402 via pivots 214. Pivots 214 allows latches 210 to be rotatable latches, which are resident to DCA 402. Springs 222 are supported by spring mounts 220, and are attached to AMA 404. For example, spring mounts 220 are attached to AMA 404 utilizing screws. Claw catch 226 is coupled (e.g., mechanically coupled utilizing a screw) to one or more areas of AMA 404.

FIG. 4 depicts latches 210 as open. Upon applying a force to latches 210 (e.g., force 230 in FIG. 2A), the latches close and screw housings 216, which include respective instances of floating screws 218, pass through respective instances of openings 232 in bracket assembly 228. Then, upon fully inserting DCA 402 into AMA 404, floating screws 218 mate with respective instances of thread assemblies 224 of springs 222. For example, floating screws 218 are tightened into respective thread assemblies 224 to a fixed torque (securing latches 210 and deforming springs 222), which is a torque capable of overcoming any residual connector mating force (e.g., between DCA 402 and AMA 404, or a CEC that is connecting to DCA 402). In another embodiment, screw housings 216 do not pass through openings 232 and can mate to a face of bracket assembly 228.

In an example embodiment, securing DCA 402 by screwing floating screws 218 into thread assemblies 224, mated electrical connections of DCA 402 experience a "pre-load" of a continuous force. For example, DCA 402 is a power supply and includes electrical connections of output connectors. When the power supply is inserted and secured into a CEC and AMA 404 utilizing latches 210, the output connectors mate to the corresponding connectors of the CEC, and the mated connection experiences a continuous force (e.g., a substantially constant mechanical pre-load).

Figure 5:
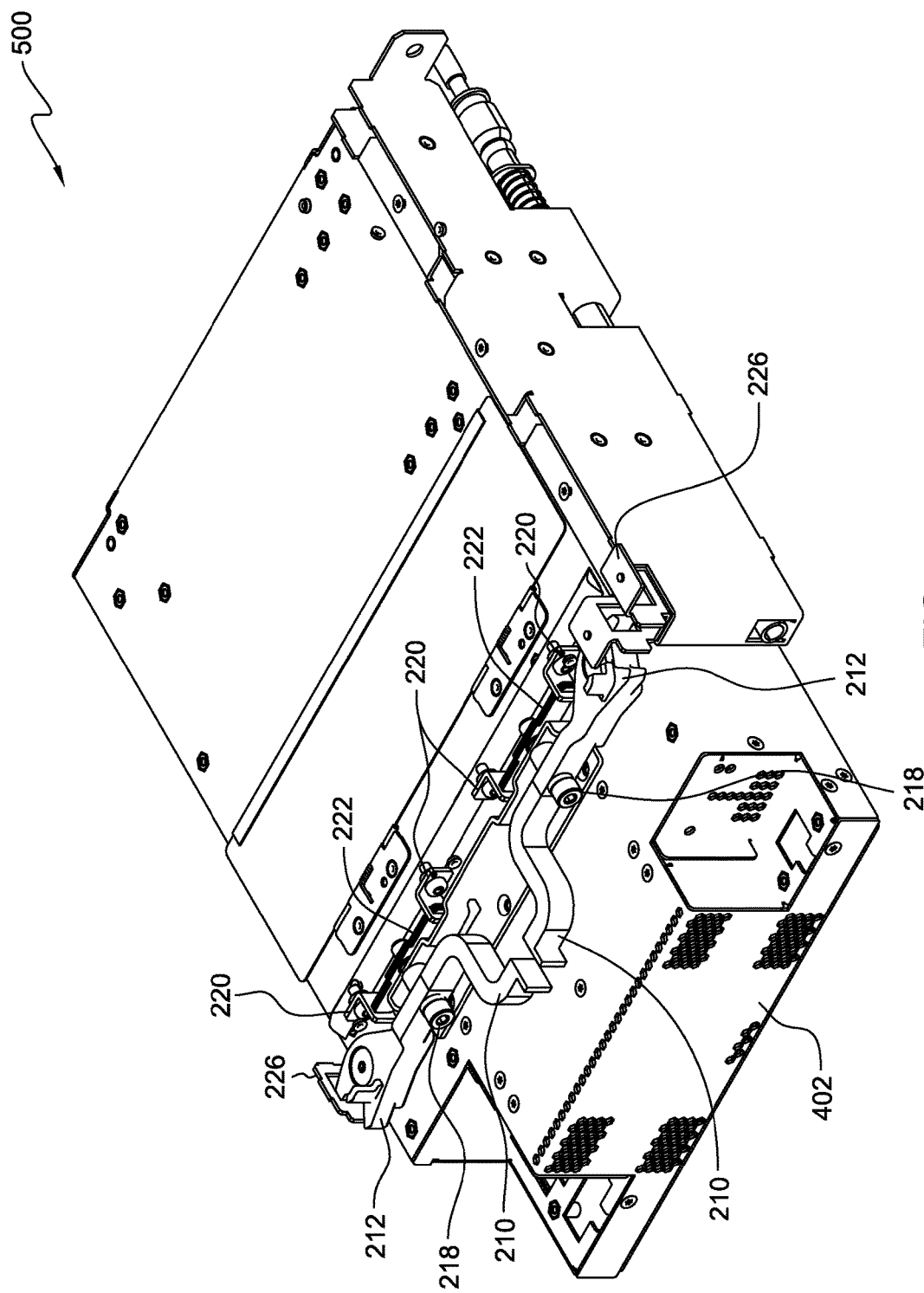
FIG. 5 illustrates an electronic assembly that includes a latch assembly, in accordance with embodiments of the present invention.

FIG. 5 illustrates a view of electronic assembly 500, in accordance with embodiments of the present invention.

Electronic assembly 500 depicts DCA 402 with latches 210 closed; and therefore, DCA 402 is secured to a supporting structure (e.g., an AMA not shown) utilizing a receiving feature of the supporting structure (i.e., spring mounts 220, springs 222, and thread assemblies 224).

In the depicted embodiment, latch claws 212 are engaged to claw catches 226, which are attached to a supporting structure (e.g., an AMA not shown). Further in the depicted embodiment, floating screws 218 mate latches 210 to springs 222 (utilizing thread assemblies 224), which are attached to a supporting structure (e.g., an AMA not shown).

What is claimed is:

1. An apparatus for mating computing device structures, the apparatus comprising:
   one or more rotatable latches, the one or more rotatable latches each including a respective screw mechanism housed within the one or more rotatable latches, wherein the one or more rotatable latches are coupled to a pluggable electronic device;
   one or more spring assemblies, the one or more spring assemblies each including a respective thread assembly housed within the one or more spring assemblies, wherein the one or more spring assemblies are coupled to an air moving assembly (AMA);
   wherein the respective thread assemblies comprise threading that is capable of receiving a corresponding screw mechanism of the one or more rotatable latches, and wherein the respective screw mechanisms are floating screws that are housed within an opening in the one or more rotatable latches;
   wherein the AMA is a supporting structural enclosure that includes an opening that is capable of housing and enclosing at least a portion of the pluggable electronic device when the one or more rotatable latches are in a closed position and the respective screw mechanisms of the one or more rotatable latches are threaded into corresponding thread assemblies housed within the one or more spring assemblies;
   the one or more rotatable latches including a claw portion;
   one or more claw catching structures, wherein the one or more claw catching structures are receiving features for the claw portions when the one or more rotatable latches are in a closed position, and wherein the one of more claw catching structures are coupled to a pluggable electronic device; and
   wherein the AMA supporting structure enclosure houses and encloses at the portion of the pluggable electronic device when the one or more rotatable latches are: (i) in a closed position and engaged to respective instances of the one or more spring assemblies utilizing respective floating screws and respective thread assemblies, (ii) in a closed position while having the respective claw portions of the one or more rotatable latches being engaged to respective claw catching structures that are coupled to the AMA, and (iii) providing a mechanical load on mating electronic connectors of the pluggable electronic device and another electronic device.

2. The apparatus of claim 1, wherein the pluggable electronic assembly device is a power supply.

3. The apparatus of claim 1, wherein the one or more rotatable latches coupled to the pluggable electronic device further comprises a pivot point coupling each of the one or more rotatable latches to the pluggable electronic device.

4. The apparatus of claim 1, wherein the one or more spring assemblies coupled to the AMA further comprises at least one spring mount coupling each of the one or more spring assemblies to the AMA.

5. The apparatus of claim 1, wherein the one or more spring assemblies are comprised of one or more leaf springs.

6. The apparatus of claim 4:
   wherein the one or more spring assemblies are comprised of one or more leaf springs; and
   wherein the at least one spring mount couples each of the one or more spring assemblies aligned horizontally to the AMA.

7. An apparatus for mating computing device structures, the apparatus comprising:
   one or more rotatable latches, the one or more rotatable latches each including a respective floating screw mechanism housed within the one or more rotatable latches, wherein the one or more rotatable latches are coupled to a pluggable electronic device;
   one or more spring assemblies, the one or more spring assemblies each including a respective thread assembly housed within the one or more spring assemblies, wherein the one or more spring assemblies are coupled to an air moving assembly (AMA);
   wherein the respective thread assemblies comprise threading that is capable of receiving a corresponding floating screw mechanism of the one or more rotatable latches;
   wherein the AMA is a supporting structural enclosure that includes an opening that is capable of housing and enclosing at least a portion of the pluggable electronic device when the one or more rotatable latches are in a closed position and the respective floating screw mechanisms of the one or more rotatable latches are threaded into corresponding thread assemblies housed within the one or more spring assemblies;
   wherein the one or more spring assemblies are capable of deforming in response to advancing a corresponding floating screw mechanism into the respective thread assembly;
   the one or more rotatable latches including a claw portion;
   one or more claw catching structures, wherein the one or more claw catching structures are receiving features for the claw portions when the one or more rotatable latches are in a closed position, and wherein the one of more claw catching structures are coupled to a pluggable electronic device; and wherein the AMA supporting structure enclosure houses and encloses at the portion of the pluggable electronic device when the one or more rotatable latches are: (i) in a closed position and engaged to respective instances of the one or more spring assemblies utilizing respective floating screw mechanisms and respective thread assemblies, (ii) in a closed position while having the respective claw portions of the one or more rotatable latches being engaged to respective claw catching structures that are coupled to the AMA, and (iii) providing a mechanical load on mating electronic connectors of the pluggable electronic device and another electronic device.

8. The apparatus of claim 7, wherein the one or more spring assemblies are comprised of one or more leaf springs.

9. The apparatus of claim 7, wherein advancing the corresponding floating screw mechanism into the respective thread assembly further comprises: the one or more rotatable latches being in a closed position and screwing the respective floating screw mechanism into the respective thread assembly, engaging the corresponding floating screw mechanism into the respective thread assembly, which provides a load on the one or more spring assemblies.

10. The apparatus of claim 7, further comprising:
the one or more rotatable latches including a claw portion; and
one or more claw catching structures, the one or more claw catching structures comprising receiving features that are capable of receiving and engaging the claw portions when the one or more rotatable latches are in a closed position.

11. The apparatus of claim 10, wherein the one of more claw catching structures are coupled to a pluggable electronic device.

12. The apparatus of claim 7:
wherein the one or more rotatable latches are capable of providing a mechanical advantage capable of overcoming a resistance force for mating the pluggable electronic device to a second electronic device; and
wherein the second electronic device includes electronic connectors corresponding to receiving electronic connectors of the pluggable electronic device.

13. The apparatus of claim 7, wherein the one or more rotatable latches, being in a closed position and engaged to respective instances of the one or more spring assemblies utilizing respective floating screws and respective thread assemblies, are capable of providing the mechanical load on mater electronic connectors of the pluggable electronic device and a second electronic device.

14. The apparatus of claim 1:
wherein the receiving features of the claw catching structures include an opening that allows respective claw portions of the one or more rotatable latches to engage the receiving features of the claw catching structures, while also having a portion of the respective claw portion of the one or more rotatable latches be positioned through the opening included in the receiving features of the claw catching structures; and
wherein the one or more rotatable latches: (i) being in a closed position and engaged to respective instances of the one or more spring assemblies utilizing respective floating screws and respective thread assemblies and (ii) being in a closed position while having the respective claw portions of the one or more rotatable latches being engaged to respective claw catching structures that are coupled to the AMA, provide the mechanical load on mating electronic connectors of the pluggable electronic device and the another electronic device, wherein the another electronic device is a computing device that is capable of utilizing and connecting to the pluggable electronic device.

15. The apparatus of claim 7:
wherein the receiving features of the claw catching structures include an opening that allows respective claw portions of the one or more rotatable latches to engage the receiving features of the claw catching structures, while also having a portion of the respective claw portion of the one or more rotatable latches be positioned through the opening included in the receiving features of the claw catching structures; and
wherein the one or more rotatable latches: (i) being in a closed position and engaged to respective instances of the one or more spring assemblies utilizing respective floating screw mechanisms and respective thread assemblies and (ii) being in a closed position while having the respective claw portions of the one or more rotatable latches being engaged to respective claw catching structures that are coupled to the AMA, provide the mechanical load on mating electronic connectors of the pluggable electronic device and the another electronic device, wherein the another electronic device is a computing device that is capable of utilizing and connecting to the pluggable electronic device.

* * * * *